United States Patent
Nishino et al.

(10) Patent No.: US 6,766,261 B2
(45) Date of Patent: Jul. 20, 2004

(54) METHOD AND DEVICE GENERATING DATA INPUT TO AN ELECTROMAGNETIC FIELD INTENSITY CALCULATING DEVICE

(75) Inventors: Sekiji Nishino, Kawasaki (JP); Takeshi Kishimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 63 days.

(21) Appl. No.: 10/057,887

(22) Filed: Jan. 29, 2002

(65) Prior Publication Data

US 2002/0140435 A1 Oct. 3, 2002

(30) Foreign Application Priority Data

Mar. 27, 2001 (JP) ........................................ 2001-089735

(51) Int. Cl.[7] .......................... G01R 27/28; H04B 17/00
(52) U.S. Cl. ................................. 702/65; 716/3; 703/4; 395/500.26; 324/627
(58) Field of Search ............................ 702/57, 65, 189; 703/2, 4, 5, 21; 324/627, 639; 716/3; 395/500.26

(56) References Cited

U.S. PATENT DOCUMENTS

| 5,650,935 A | * | 7/1997 | Nishino et al. ............... 702/57 |
| 5,745,370 A | * | 4/1998 | Ohtsu et al. .................... 716/3 |
| 5,940,310 A | * | 8/1999 | Yamaguchi et al. ........... 703/4 |
| 5,966,524 A | * | 10/1999 | Burnett et al. ......... 395/500.26 |

FOREIGN PATENT DOCUMENTS

| JP | A-04-222061 | 8/1992 | |
| JP | A-07-234890 | 9/1995 | .................. 702/57 |
| JP | A-07-302278 | 11/1995 | ..................... 716/3 |

* cited by examiner

Primary Examiner—John Barlow
Assistant Examiner—John Le
(74) Attorney, Agent, or Firm—Staas & Halsey LLP

(57) ABSTRACT

A method, which generates data input to a device calculating the intensity of an electromagnetic field emitted from an electric circuit device, extracts surface data of a metal cabinet from the three-dimensional data of the electric circuit device, partitions the surface corresponding to the surface data into quadrilateral meshes, and outputs the data partitioned into meshes to the electromagnetic field intensity calculating device.

5 Claims, 36 Drawing Sheets

 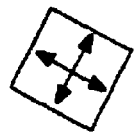
FOR TRIANGLE, ELECTRIC CURRENTS ARE CALCULATED FROM VERTEXES TO OPPOSITE SIDE DIRECTIONS
FOR QUADRILATERAL, ELECTRIC CURRENTS IN OPPOSITE SIDE DIRECTIONS ARE CALCULATED
FIG. 1  PRIOR ART FOR TRIANGLE, ELECTRIC
CURRENT FLOWS UNEVENLY,
AND PROPAGATION DELAY
OCCURS
(ANALYSIS ACCURACY: LOW)

FOR QUADRILATERAL,
ELECTRIC CURRENT
SMOOTHLY FLOWS
(ANALYSIS ACCURACY: HIGH)

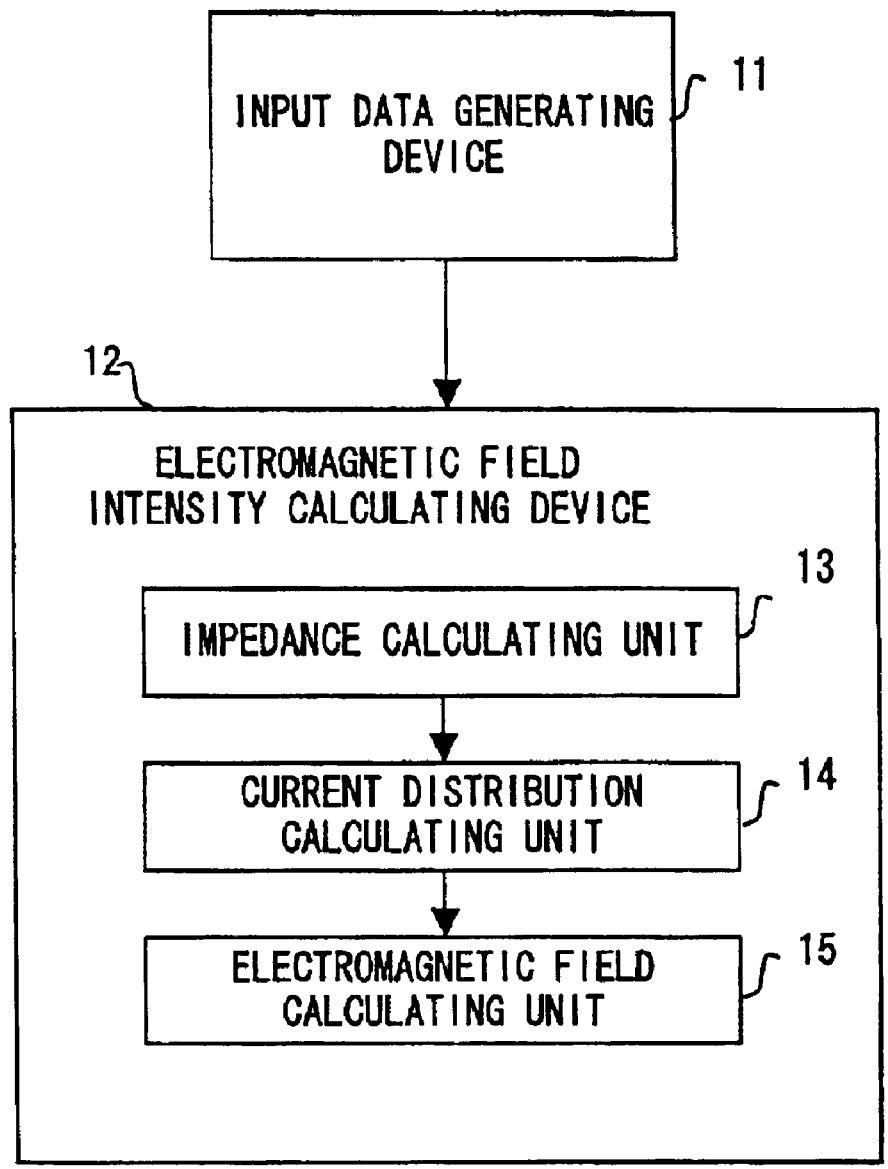
F I G. 4

| NAME | SUMMARY |
|---|---|
| ENTITY ID | SURFACE NUMBER OF B-SPLINE CURVED SURFACE |
| K1 | SUPERSCRIPT OF TOTAL SUM SYMBOL IN S DIRECTION |
| K2 | SUPERSCRIPT OF TOTAL SUM SYMBOL IN T DIRECTION |
| M1 | ORDER OF BASE FUNCTION |
| M2 | ORDER OF BASE FUNCTION |
| PROP1 | PARAMETER 1 INDICATING STATE OF CURVED SURFACE |
| PROP2 | PARAMETER 2 INDICATING STATE OF CURVED SURFACE |
| PROP3 | PARAMETER 3 INDICATING STATE OF CURVED SURFACE |
| PROP4 | PARAMETER 4 INDICATING STATE OF CURVED SURFACE |
| PROP5 | PARAMETER 5 INDICATING STATE OF CURVED SURFACE |
| S(-M1) | NOT SEQUENCE VALUE IN S DIRECTION |
| ∼ | |
| T(-M2) | NOT SEQUENCE VALUE IN T DIRECTION |
| ∼ | |
| W(0,0) | WEIGHT |
| ∼ | |
| X(0,0) | SPATIAL COORDINATE VALUE OF EACH CONTROL POINT(X) |
| Y(0,0) | SPATIAL COORDINATE VALUE OF EACH CONTROL POINT(Y) |
| Z(0,0) | SPATIAL COORDINATE VALUE OF EACH CONTROL POINT(Z) |
| ∼ | |
| U(0) | START VALUE IN S DIRECTION |
| U(1) | END VALUE IN S DIRECTION |
| V(0) | START VALUE IN T DIRECTION |
| V(1) | END VALUE IN T DIRECTION |

F I G. 7

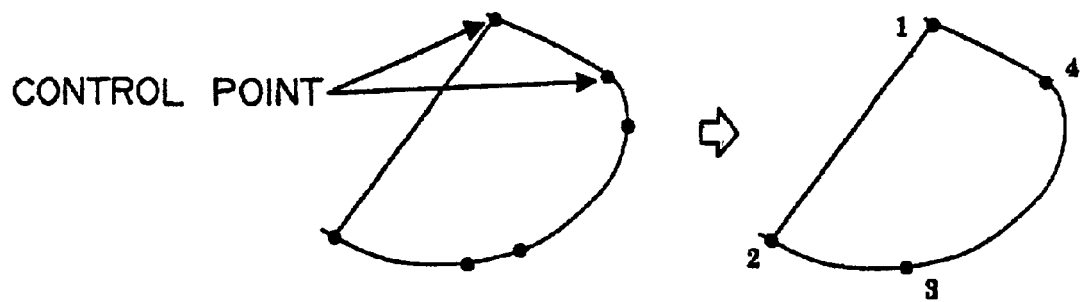
F I G. 10

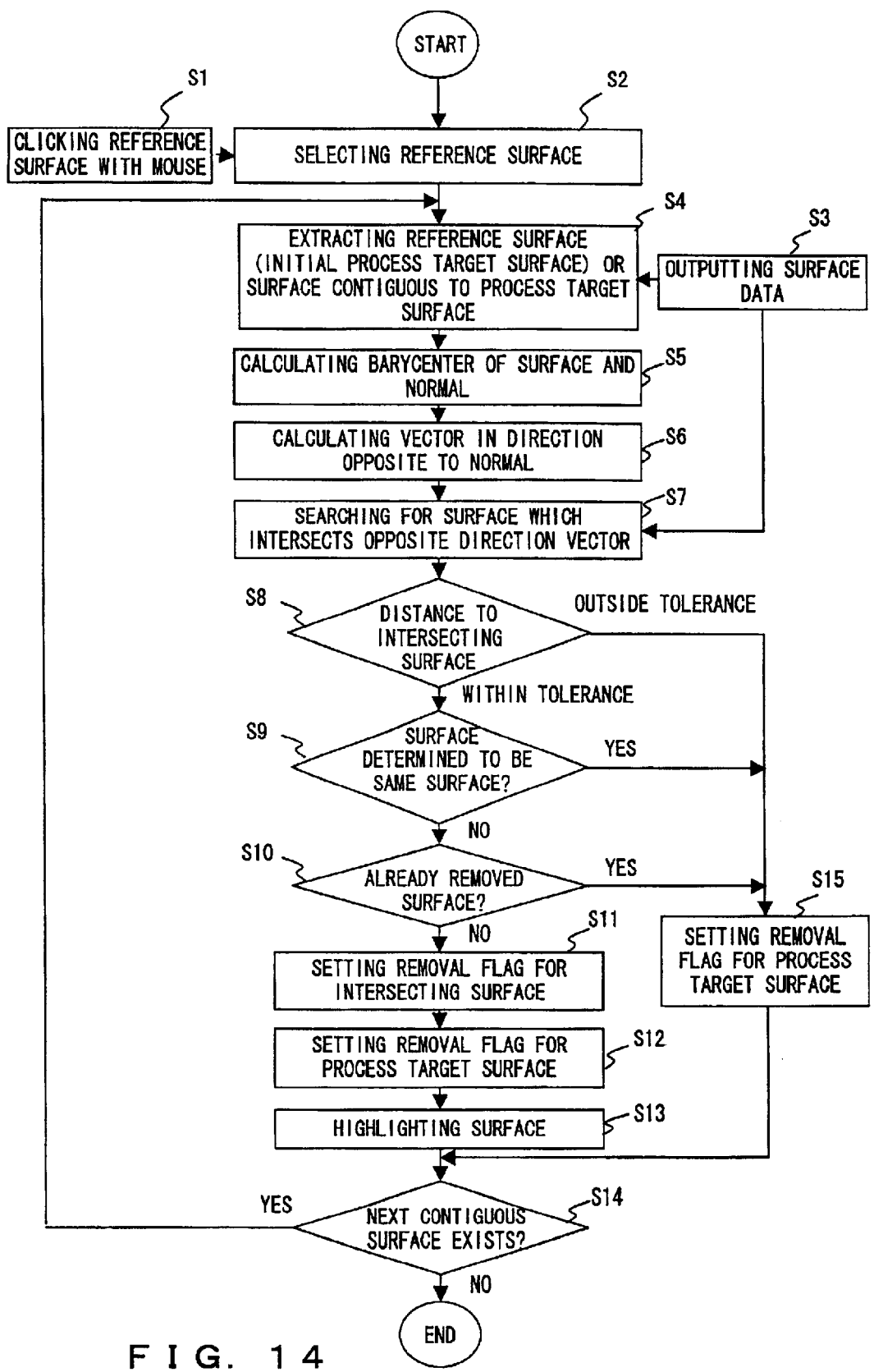
F I G. 1 4

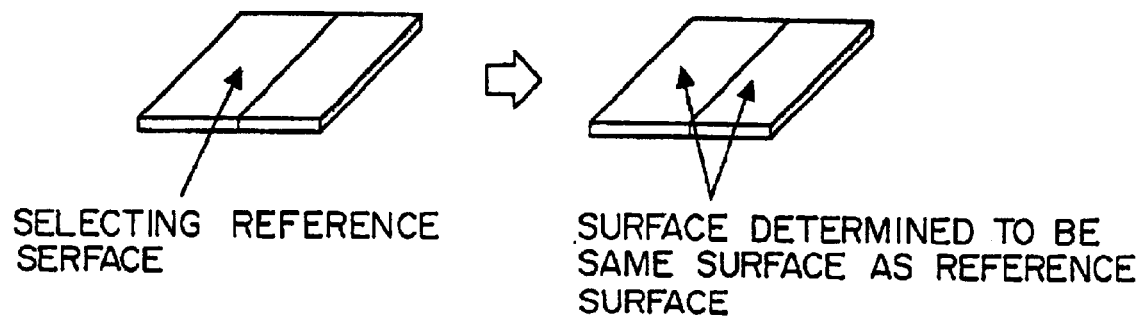
SELECTING REFERENCE SERFACE
SURFACE DETERMINED TO BE SAME SURFACE AS REFERENCE SURFACE
F I G. 20

COORDINATE SPECIFICATION DATA OF POLYGON VERTEX: $point

<KEYWORD · STATEMENT>
    $point
<DATA · STATEMENT>
    Point no.  POINT NUMBER
    X         X COORDINATE VALUE
    Y         Y COORDINATE VALUE
    Z         Z COORDINATE VALUE
<DESCRIPTION EXAMPLE>
    $point
    1    0.035  0.012  0.8

SPECIFICATION DATA OF POLYGON CONFIGURING POINT: $patch

<KEYWORD · STATEMENT>
    $patch
<DATA · STATEMENT>
    Patch no.  PATCH NUMBER
    Point 1    POINT NUMBER WHICH BECOMES FIRST CONFIGURING POINT OF PATCH
    Point 2    POINT NUMBER WHICH BECOMES SECOND CONFIGURING POINT OF PATCH
    Point 3    POINT NUMBER WHICH BECOMES THIRD CONFIGURING POINT OF PATCH
    Point 4    POINT NUMBER WHICH BECOMES FOURTH CONFIGURING POINT OF PATCH
<DESCRIPTION EXAMPLE>
    $patch
    1   10   11   12   13

FIG. 31

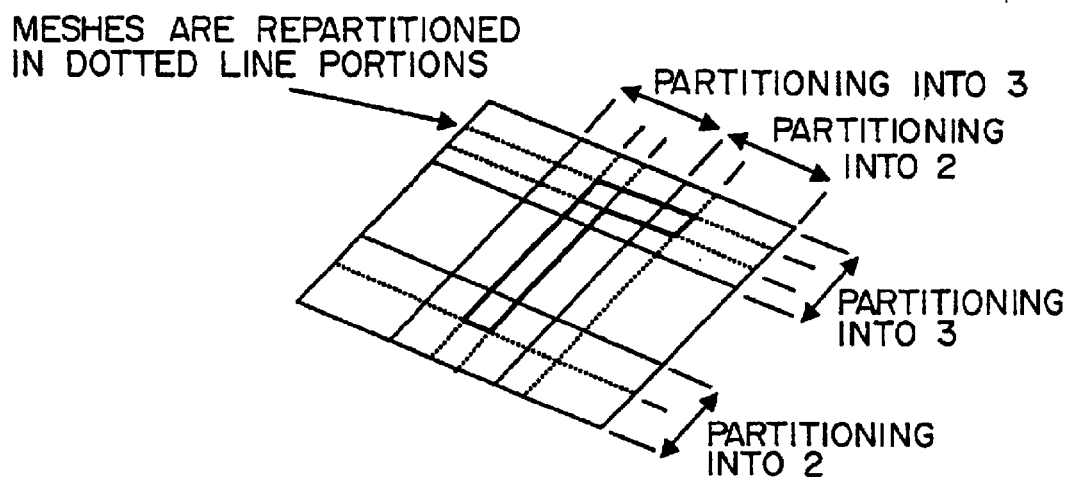
F I G. 35

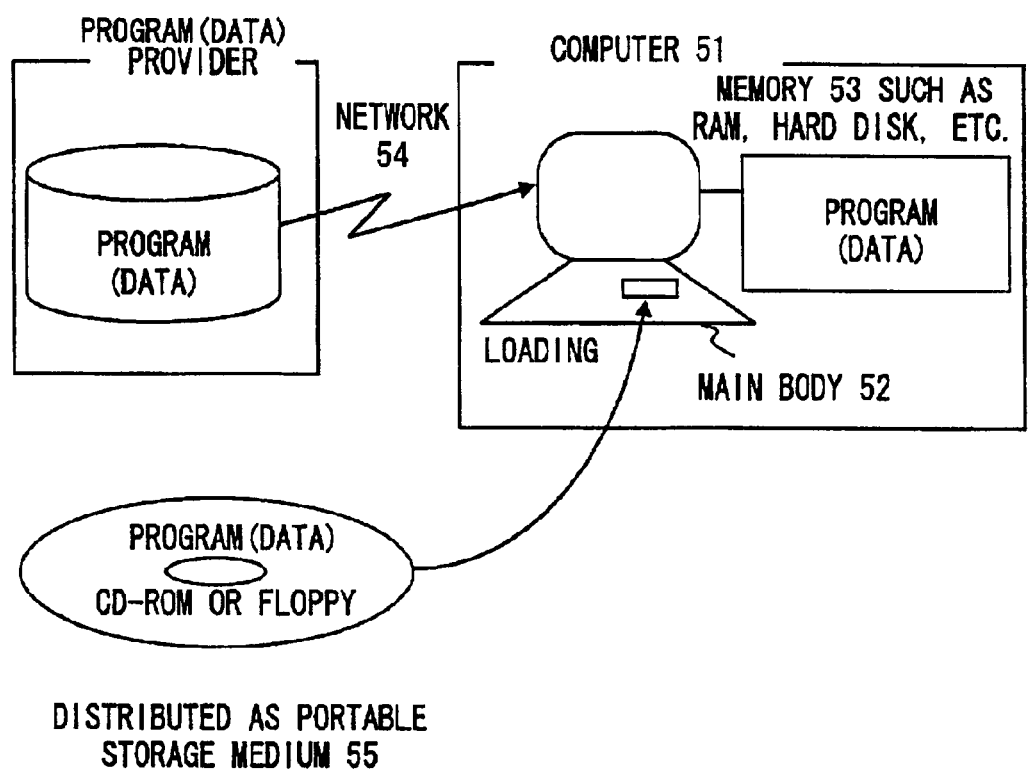
F I G. 36

METHOD AND DEVICE GENERATING DATA INPUT TO AN ELECTROMAGNETIC FIELD INTENSITY CALCULATING DEVICE

BACKGROUND OF THE INVENTION

1. Field of the Invention

The present invention relates to a method calculating the intensity of an electromagnetic field emitted from an electric circuit device, and more particularly, to a method and device generating data input to an electromagnetic field intensity calculating device which calculates the intensity of an electromagnetic field emitted from an electric circuit device by using a moment method.

2. Description of the Related Art

The electromagnetic field intensity of an electromagnetic wave emitted from an object having an arbitrary shape, for example, an electric circuit device can be easily calculated if an electric current which flows in each part of the object is known. Theoretically, the value of an electric current is given by solving the Maxwell's electromagnetic field equations under a given boundary condition. However, there is no theoretical solution to an object having an arbitrary shape under a complex condition.

Accordingly, all of electric current calculation methods used in a current electromagnetic field intensity calculating device are approximation methods. Three methods such as an infinitesimal loop antenna approximation method, a distributed constant line approximation method, and a moment method are known as the approximation solutions.

The infinitesimal loop antenna approximation method is a method with which a wire interconnecting a wave source circuit and a load circuit is handled as a loop antenna, and an electric current on the loop is obtained with a calculation of a lumped constant circuit by assuming that the electric current on the loop is flat. Although the calculation of this method is the simplest, its accuracy is low under a condition that the size of a loop cannot be ignored in comparison with the wavelength of an electromagnetic wave.

The distributed constant line approximation method is a method with which an electric current is obtained by applying the distributed constant line equations to an object that can be approximated to a one-dimensional structure. Its calculation is relatively easy, and an electric current can be quickly obtained with high accuracy. However, for an object to be analyzed, which cannot be approximated to a one-dimensional structure, by way of example, an object having an arbitrary shape such as a printed circuit board, a metal cabinet, etc., an electric current cannot be obtained.

In the meantime, the moment method is one solution of integral equations derived from the Maxwell's electromagnetic field equations, and can handle a three-dimensional object having an arbitrary shape. With this method, an object is partitioned into small elements (patches or meshes), and an electric current is calculated.

If the intensity of an electromagnetic field emitted from an electric circuit device is calculated with the moment method, it can be calculated with high accuracy by combining all of constituent elements such as a printed circuit board, a cable, a lead, a metal cabinet, etc. within the electric circuit device, and by accurately putting the device into a model.

Three-dimensional data and data of wires are captured from a CAD as data of a printed circuit board, a cable, a lead, etc., so that an analysis model can be generated with relative ease. However, for three-dimensional structure data such as the metal cabinet of an electric circuit device, etc., a mesh model must be generated by partitioning the data into meshes (patches) which are suitable for the moment method after capturing the data from a CAD. At this time, the model must be generated accurately and efficiently.

Conventionally, a metal cabinet of an electric circuit device, etc. is conventionally partitioned into meshes (patches) shaped like triangles each of which is configured by 3 points, as an automatic partitioning method, even if the metal cabinet, etc. is partitioned into meshes which are suitable for the moment method. As will be described later, a mesh partitioning method that is most suitable for the moment method is a method partitioning into quadrilaterals. Conventionally, however, it is difficult to automatically partition a metal cabinet, etc. into quadrilateral meshes each of which is configured by four points.

That is, conventionally, for a portion that cannot be partitioned as a quadrilateral, or a portion having a hole, CAD data must be manually changed so that a CAD model must be modified to a form suitable for partitioning into quadrilateral meshes. This requires much time and labor.

FIGS. 1, 2A, and 2B explain the influences that different mesh shapes exert on an electric current calculation using the moment method. FIG. 1 explains the difference between electric current calculations within meshes (patches). In this figure, electric currents flowing from vertexes to the directions (indicated by arrows) of opposite sides are calculated for a triangle mesh, whereas electric currents flowing to the directions of opposite sides are calculated for a quadrilateral mesh.

FIGS. 2A and 2B explain the directions of electric currents as a whole in the case where such meshes are combined. If partitioning is made into triangle meshes as shown in FIG. 2A, the flow of an electric current becomes zigzag, namely, uneven, and the length of a path on which the electric current flows becomes longer. As a result, a propagation delay of the electric current occurs, and the accuracy of an analysis made with the moment method is degraded. In the meantime, if partitioning is made into quadrilateral meshes, an electric current smoothly flows, and the accuracy of an analysis made with the moment method is improved.

SUMMARY OF THE INVENTION

An object of the present invention is to improve the analysis accuracy of an electromagnetic field intensity calculation as a whole, and to increase an efficiency of the process of the electromagnetic field intensity calculation in view of the above described problem by automatically partitioning a metal cabinet of an electric circuit device, etc. into quadrilateral meshes which are suitable for an electric current calculation using the moment method, and by providing the partitioned data to an electromagnetic field intensity calculating device.

A method generating data input to an electromagnetic field intensity calculating device according to the present invention, which is a method generating data input to an electromagnetic field intensity calculating device that calculates the intensity of an electromagnetic field emitted from an electric circuit device having a metal cabinet, extracts surface data of the metal cabinet from three-dimensional data of the electric circuit device, partitions the surface corresponding to the surface data into quadrilateral meshes, and outputs the data partitioned into meshes to the electromagnetic field intensity calculating device.

According to the present invention, a metal cabinet model which is suitable for a calculation of the moment method, namely, a model partitioned into quadrilateral meshes can be automatically and quickly generated from the three-dimensional structure data of a CAD system, and such a model is output to an electromagnetic field intensity calculating device, thereby accurately calculating the intensity of an electromagnetic field emitted from the whole of an electric circuit device including its metal cabinet. This can greatly contribute to an improvement in the practicality of the electromagnetic field intensity calculating device.

BRIEF DESCRIPTION OF THE DRAWINGS

FIG. 1 explains the difference between electric current calculations depending on mesh shapes;

FIG. 4 shows the relationship between an input data generating device according to the present invention and an electromagnetic field intensity calculating device;

FIG. 7 shows the data structure of a CAD data file;

FIG. 10 explains the method extracting four vertexes to approximate each surface to a quadrilateral from control points representing each surface configuring the same surface;

FIG. 14 is a flowchart showing the details of a same surface extraction process;

FIG. 20 explains a same surface of a metal plate having a flat surface;

FIG. 31 shows the structure of data partitioned into meshes;

FIG. 35 exemplifies mesh shape alignment; and

FIG. 36 explains the loading of a program according to a preferred embodiment into a computer.

DESCRIPTION OF THE PREFERRED EMBODIMENTS

Figure 2A:
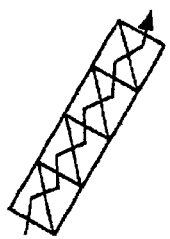
FIGS. 2A and 2B explain the difference between the directions of electric currents flowing in triangle and quadrilateral meshes.
Figure 2B:
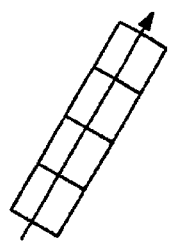
Figure 3:
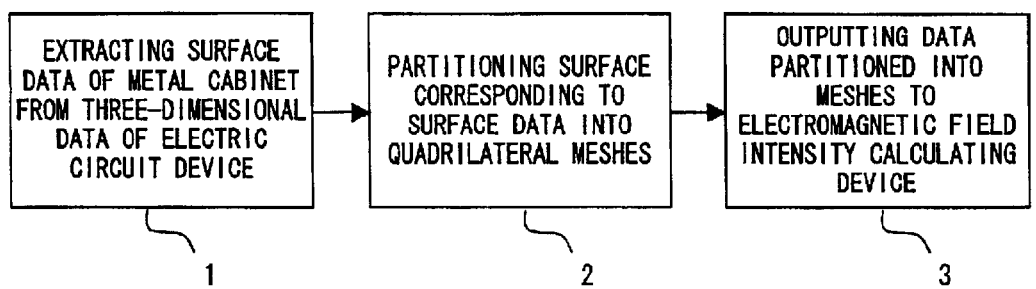
FIG. 3 is a block diagram showing the principle of the present invention.

FIG. 3 is a block diagram showing the principle of the present invention. This figure is a block diagram showing the functions of a method generating data input to an electromagnetic field intensity calculating device which calculates the intensity of an electromagnetic field emitted from an electric circuit device having a metal cabinet.

In this figure, with the input data generating method according to the present invention, surface data of a metal cabinet is extracted from three-dimensional data of an electric circuit device in 1, the surface corresponding to the surface data is partitioned into quadrilateral meshes in 2, and the data partitioned into meshes is output to an electromagnetic field intensity calculating device in 3.

In a preferred embodiment of the present invention, if surface data of a metal cabinet is composed of a plurality of pieces of surface data including the front and the back of a metal plate which configures the metal cabinet, data of a same surface composed of a plurality of surfaces that exist on the front or the back of the metal plate is extracted from the plurality of pieces of surface data, and each of the surfaces configuring the same surface can be also partitioned into quadrilateral meshes.

Additionally, control points corresponding to the vertexes of a quadrilateral can be extracted by using the data of control points as the surface data of each of surfaces which configure the same surface, when each of the surfaces is approximated to the quadrilateral. Furthermore, the control points corresponding to the vertexes of the quadrilateral which approximates each of the surfaces are recognized as 4 vertexes, and a flat or a curved surface determined by the data of the control points is equally partitioned for respective pairs of opposite sides so that the surface can be partitioned into quadrilateral meshes.

Furthermore, in the preferred embodiment according to the present invention, if surface data of a metal cabinet is data corresponding to a plurality of surfaces, each of the plurality of surfaces is partitioned into quadrilateral meshes, and a comparison is made between the coordinates of partitioning points on two sides that can possibly be a side shared by contiguous surfaces among the plurality of surfaces. If the coordinates of the partitioning points are determined to match within a preset tolerance, the data of the partitioning points are recognized to be data shared by the contiguous surfaces. The data which is partitioned into meshes and includes the shared data can be output to the electromagnetic field intensity calculating device.

Furthermore, in the preferred embodiment, if a surface whose material is different from a metal cabinet, and which is superposed on a surface corresponding to surface data of the metal cabinet and has an area smaller than the surface corresponding to the surface data, quadrilateral meshes are repartitioned by being aligned with the shape of the surface having the smaller area, after the surface corresponding to the surface data is partitioned into the quadrilateral meshes. The repartitioned data can be output to the electromagnetic field intensity calculating device.

Used as a storage medium according to the present invention is a computer-readable storage medium used by a computer generating data input to an electromagnetic field intensity calculating device that calculates the intensity of an electromagnetic field emitted from an electric circuit device having a metal cabinet, on which is recorded a program for causing the computer to execute a process, the process comprising: receiving specification of one or more surfaces among surfaces configuring the metal cabinet from a user; extracting surface data of the specified surface from the three-dimensional data of the electric circuit device; partitioning the surface corresponding to the surface data into quadrilateral meshes; and outputting the data partitioned into meshes to the electromagnetic field intensity calculating device.

A device according to the present invention, which generates data input to an electromagnetic field intensity calculating device, comprises a surface data extracting unit extracting surface data of a metal cabinet from three-dimensional data of an electric circuit device, a mesh partitioning unit partitioning the surface corresponding to the surface data into quadrilateral meshes, and a generated data outputting unit outputting the data partitioned into meshes to the electromagnetic field intensity calculating device.

As described above, according to the present invention, a surface corresponding to the surface data of a metal cabinet is partitioned into quadrilateral meshes which are suitable for a calculation of the moment method in order to generate data input to an electromagnetic field intensity calculating device which calculates the intensity of an electromagnetic field emitted from an electric circuit device having the metal cabinet.

FIG. 4 explains the relationship between an electromagnetic field intensity calculating device and an input data generating device according to the present invention, which generates data input to the electromagnetic field intensity calculating device. The output of the input data generating device 11 is provided to the electromagnetic field intensity calculating device 12, which then calculates the intensity of an electromagnetic field emitted, for example, from an electric circuit device.

A preferred embodiment of the present invention is explained by assuming that the input data generating device 11 partitions, for example, a metal cabinet of an electric circuit device into quadrilateral meshes which are suitable for a calculation of the moment method, and provides the data partitioned into meshes to the electromagnetic field intensity calculating device 12. However, the input data generating device 11 may generate input data corresponding not only to the metal cabinet, but also to constituent elements such as a printed circuit board, a cable, a lead, etc. within the electric circuit device.

The electromagnetic field intensity calculating device 12 is configured by an impedance calculating unit 13 calculating the self-impedance of each partitioned mesh (patch) or the mutual impedance between meshes, etc. in correspondence with an output of data partitioned into meshes, for example, for a metal cabinet; a current distribution calculating unit 14 calculating an electric current in each portion of an electric circuit device by using a result of the calculation made by the impedance calculating unit 13, and the voltage of a wave source, which is provided, for example, from a user; and an electromagnetic field calculating unit 15 calculating with an obtained current distribution an electric or a magnetic field at a point apart, for example, from the electric circuit device by a predetermined distance.

Figure 5:
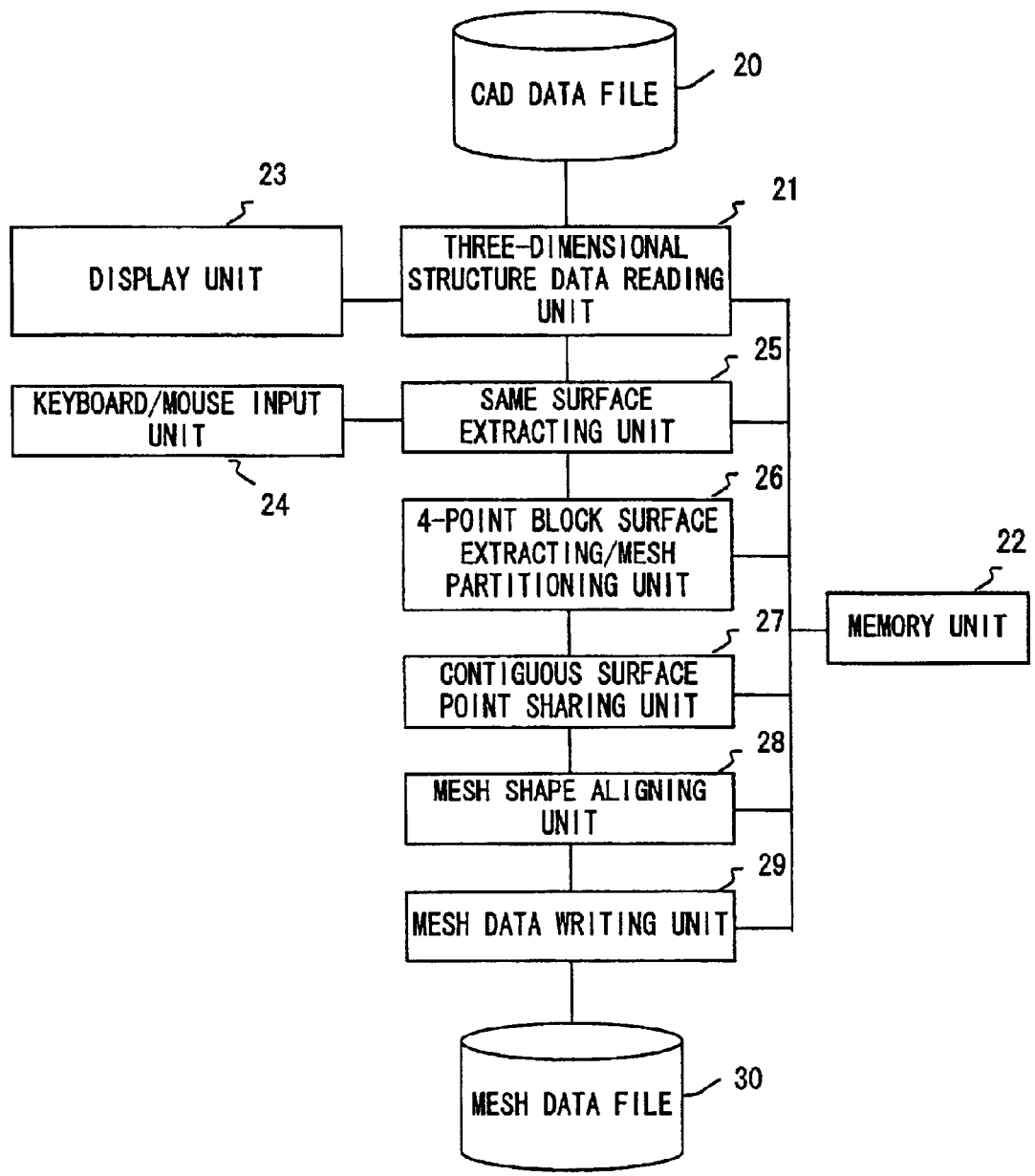
FIG. 5 is a block diagram showing the configuration of the input data generating device.

FIG. 5 is a block diagram showing the configuration of a device generating data input to an electromagnetic field intensity calculating device, according to a preferred embodiment of the present invention.

In this figure, three-dimensional structure data of a metal cabinet is read by a three-dimensional structure data reading unit 21 from a CAD data file 20, data of all surfaces are sequentially stored in a memory unit 22 as surface data, and the shape of each of the surfaces is displayed by a display unit 23. For example, a user selects a surface to be partitioned into meshes with a click via a keyboard/mouse input unit 24. The selected surface is then provided to a same surface extracting unit 25.

The same surface extracting unit 25 extracts a same surface if data of each surface stored in the CAD data file 20 is block data. The block data includes the data of the front, the back and the sides of each metal plate that configures a metal cabinet. In this case, it is sufficient to partition only either of the front and the back of the metal plate into meshes, and it is unnecessary to partition the opposite surface in the direction of the thickness of the metal plate, and the sides. Therefore, a plurality of surfaces configuring the front and the back are extracted as a same surface. If data stored in the CAD data file 20 is surface data that ignores the weight of a metal plate, this extraction process becomes unnecessary. The same surface extraction process will be described in detail later.

A result of the process performed by the same surface extracting unit 25 is provided to a 4-point block surface extracting/mesh partitioning unit 26. According to this preferred embodiment, one surface is approximated to a quadrilateral as much as possible, and the quadrilateral is equally partitioned into quadrilateral meshes for opposite sides. With the 4-point block surface extraction, 4 vertexes are extracted so that the shape of the surface before being partitioned into meshes becomes as close to a quadrilateral as possible. An extracted 4-point block surface is equally partitioned for opposite sides by using a partitioning length input via the keyboard/mouse inputting unit 24, for example, from a user.

Then, a contiguous surface point sharing unit 27 makes a comparison between the coordinates of partitioning points corresponding to a side shared by contiguous surfaces.

Partitioning points that are determined to match, for example, within a preset tolerance are recognized as data shared by the contiguous surfaces, and meshes are generated for the contiguous surfaces connected.

Next, a mesh shape aligning unit 28 repartitions the meshes in correspondence with a superposed portion of a surface of a different material. Meshes are repartitioned to align the shape of a hole, for example, if a metal plate has the hole.

Generated mesh data is stored in a mesh data file 30 by a mesh data writing unit 29. Contents of this file are output as data input to the electromagnetic field intensity calculating device, and used to analyze a radio wave leakage from a chink of a cabinet, or a shield. The process from the three-dimensional structure data reading unit 21 to the mesh data writing unit 29 is performed by using the working area of the memory unit 22 on demand.

Figure 6:
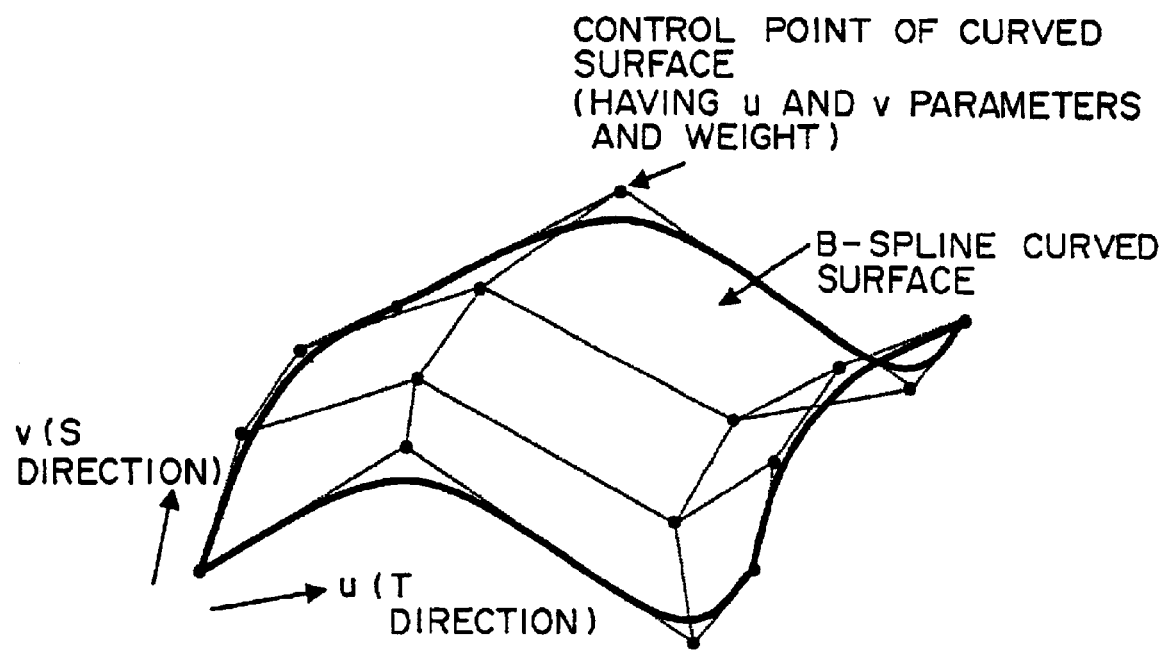
FIG. 6 explains the method representing a curved surface in a CAD data file.

The operations of the input data generating device shown in FIG. 5 are further described with reference to FIGS. 6 to 13. FIGS. 6 and 7 exemplify data stored in the CAD data file 20. FIG. 6 exemplifies a surface configuring a metal cabinet, normally, a curved surface. The curved surface is represented as a B-spline curved surface by control points of the curved surface. Each of the control points is represented by a parameter u in a T direction, a parameter v in an S direction, and a weight. Namely, a reference point having x, y, and z coordinates exists, and each of the control points has (displacement) coordinates u and v on each surface from the reference point.

FIG. 7 exemplifies the structure of CAD data corresponding to the data shown in FIG. 6. This data includes the surface number of the B-spline curved surface, spatial coordinate values X, Y, and Z of each of the control points, and the like.

Figure 8:
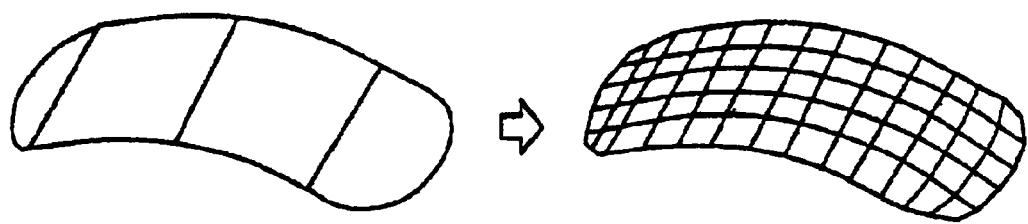
FIG. 8 explains the partitioning of a metal cabinet into quadrilateral meshes on the metal cabinet surface.

FIG. 8 explains the mesh partitioning performed by the 4-point block surface extracting/mesh partitioning unit 26. Surface data of a metal cabinet is extracted from the three-dimensional structure data stored in the CAD data file 20, and the surface corresponding to the surface data is partitioned into quadrilateral meshes on the cabinet surface. A square or a rectangle is most suitable as the quadrilateral. However, a trapezoid, a rhombus, etc. may be used.

Figure 9:
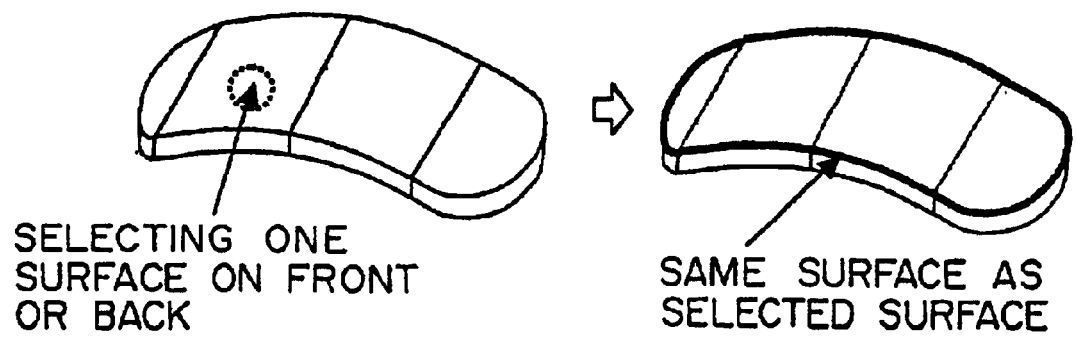
FIG. 9 explains a same surface existing on the front or the back of a metal cabinet.

FIG. 9 explains the process performed by the same surface extracting unit 25. A user specifies (selects) any of a plurality of surfaces configuring a metal cabinet via the keyboard/mouse input unit 24 shown in FIG. 5. The same surface extracting unit 25 extracts the data of the same surface existing on the front or the back of the metal cabinet depending on whether the specified surface exists either on the front or on the back.

Figure 11:
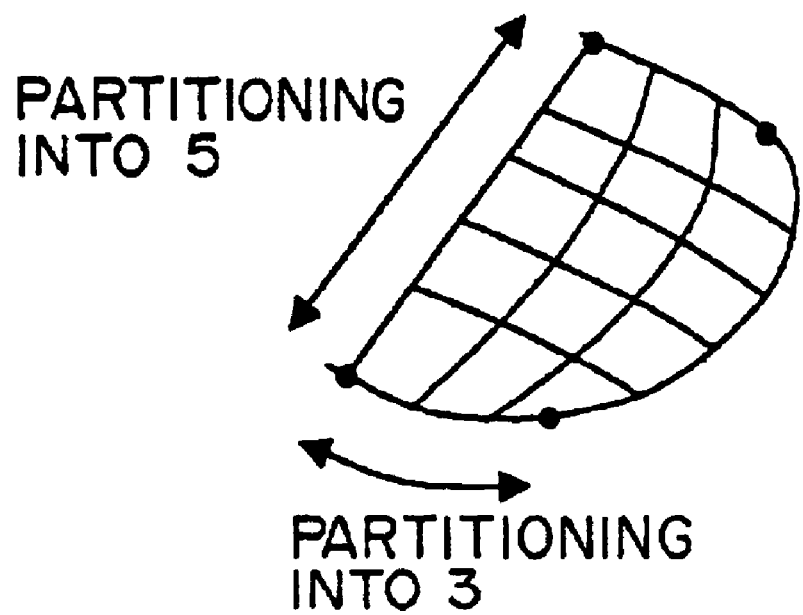
FIG. 11 explains the method equally partitioning a flat or a curved surface, which has the four points obtained in FIG. 10 as vertexes, for opposite sides.

FIGS. 10 and 11 explain the process performed by the 4-point block surface extracting/mesh partitioning unit 26. In FIG. 10, for example, control points that become four vertexes for approximating each surface to a quadrilateral are extracted from the control points that represent each of the surfaces which are extracted in FIG. 9 and configure the same surface.

In FIG. 11, the 4 control points extracted as shown in FIG. 10 are recognized as 4 vertexes of the quadrilateral, and the process for equally partitioning the flat or the curved surface configured by these 4 vertexes for opposite sides is performed.

Figure 12:
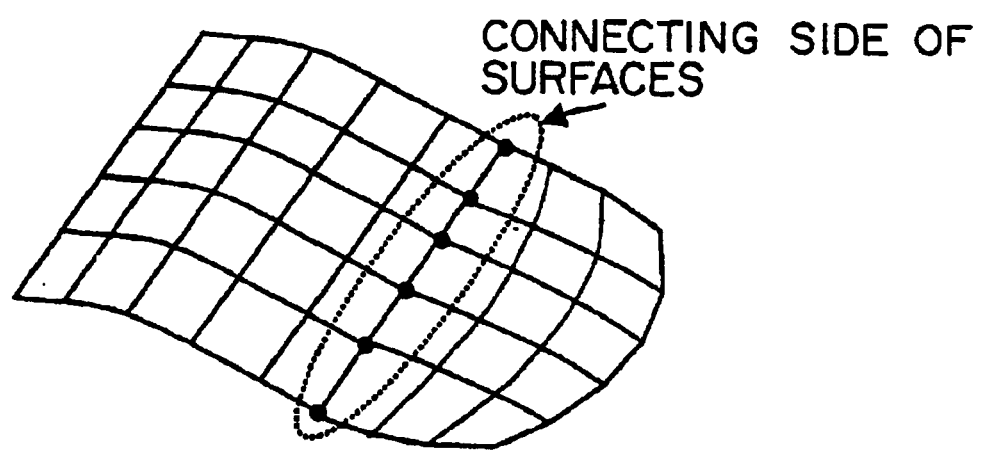
FIG. 12 explains the method sharing partitioning points on a connecting side of contiguous surfaces.

FIG. 12 explains the process performed by the contiguous surface point sharing unit 27. If coordinate values of mesh partitioning points on sides that are considered to be a side shared by contiguous surfaces to be connected are determined to be the same within a tolerance, these surfaces are recognized to be connected by this side, and the partitioning points are shared.

Figure 13:
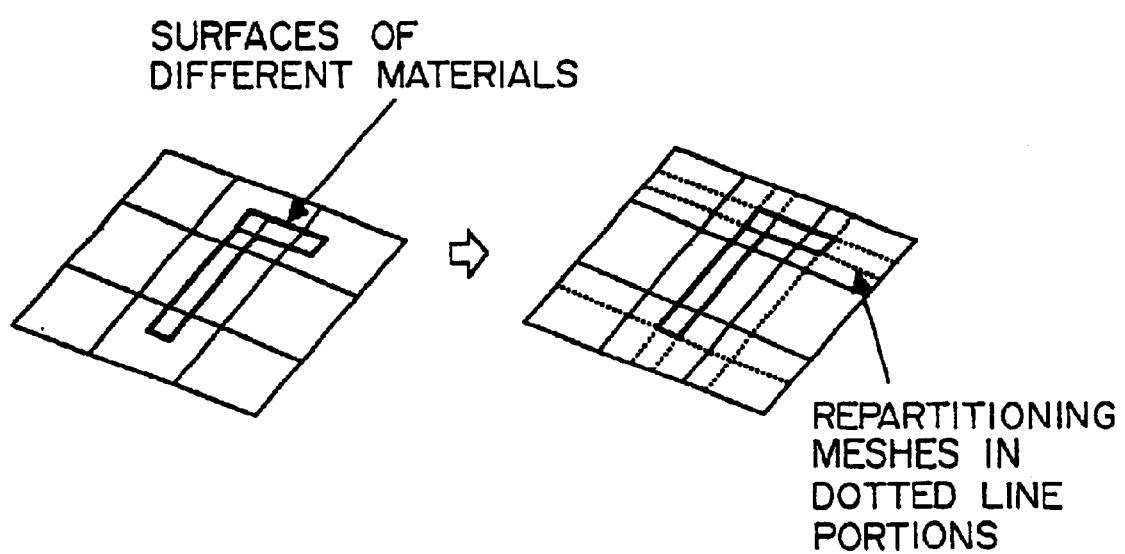
FIG. 13 explains the method repartitioning meshes in the case where surfaces of different materials are superposed.

FIG. 13 explains the process performed by the mesh shape aligning unit 28 when two surfaces of different materials are superposed. In this figure, meshes are repartitioned by being aligned with the shape of a surface having a smaller area when the surfaces of different materials are superposed. For example, the upper left square mesh among 9 large square meshes is to be repartitioned into 3 rectangular meshes on the right side of FIG. 13.

FIG. 14 is a flowchart showing the details of the same surface extraction process performed by the same surface extracting unit 25. Once the process starts in this figure, a surface configuring a metal cabinet is clicked with a mouse, for example, by a user as a reference surface in step S1. In step S2, the reference surface is selected. Then, in step S3, surface data is output from the memory unit 22 shown in FIG. 5. In step S4, the reference surface, namely, the initial process target surface, or a surface contiguous to the process target surface is extracted.

Here, the reference surface is first extracted. In step S5, the barycenter of the reference surface, and a normal in the outer direction of the metal plate are calculated. Then, in step S6, a vector in the direction opposite to the normal is calculated. In step S7, a surface which intersects in the opposite direction is searched by using the surface data.

Figure 15:
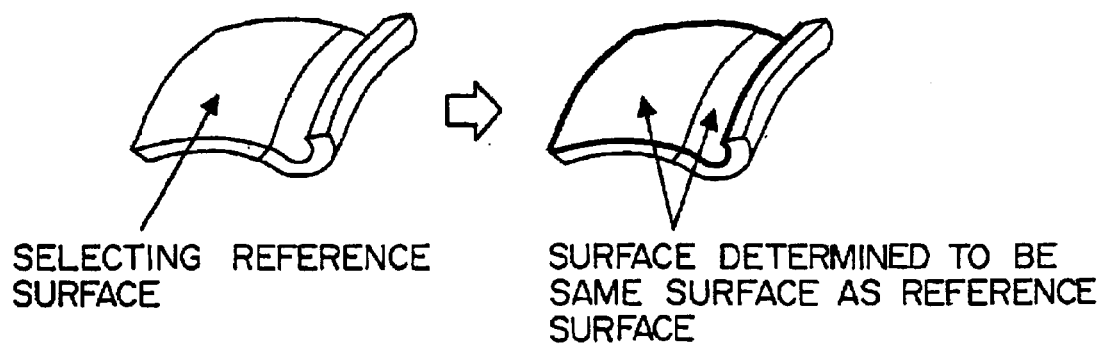
FIG. 15 explains a same surface as a curved surface.
Figure 16:
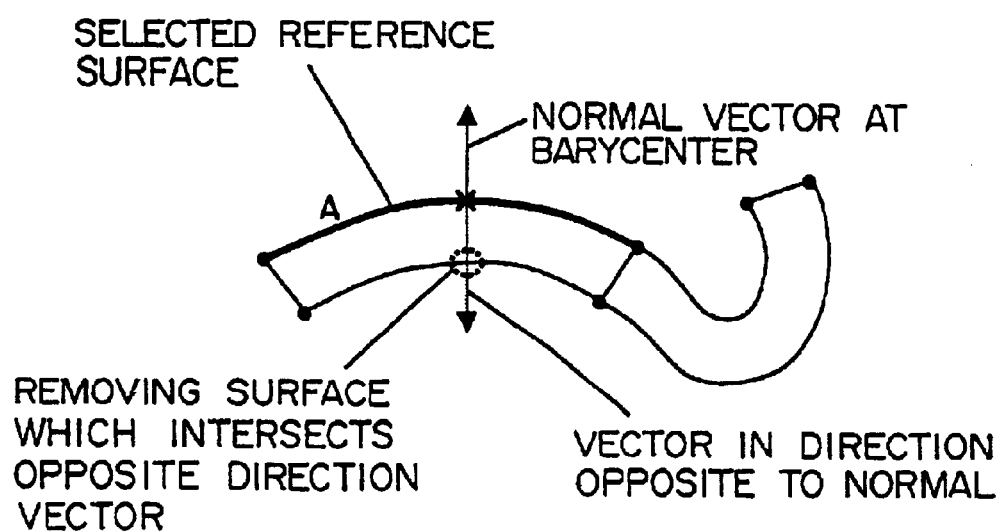
FIG. 16 explains the progression (No. 1) of the process for extracting a same surface from surface data of a metal plate having a curved surface.

Such a process is explained with reference to FIGS. 15 to 24. FIG. 15 exemplifies a curved surface of a metal cabinet, whereas FIG. 20 exemplifies a flat surface of a metal cabinet. When a user clicks an upper surface on the left side with a mouse as a reference surface in the example shown in FIG. 15, a normal vector for the selected reference surface A, and a vector in the opposite direction are calculated as shown in FIG. 16.

A surface intersecting the vector in the opposite direction is searched in step S7 of FIG. 14. In FIG. 16, the back of the reference surface A is searched. In step S8 of FIG. 14, it is determined whether or not a distance to the intersecting surface is within a preset tolerance. Here, the distance is the thickness of the metal plate. If it is determined that the distance is within the tolerance, it is further determined in step S9 whether or not the intersecting surface is a surface which has been determined as the same surface.

In FIG. 15, the surfaces to be determined as the same surface is the reference surface, and the surface right to the reference surface, namely, the upper surface on the right side. Since the process has just started at this time, the intersecting surface is determined not as the same surface. Then, in step S10, it is determined whether or not the intersecting surface is a surface which has been removed. Here, the surface is also determined not as the same surface. In step S11, a removal flag is set for this surface, and the back of the reference surface A is removed.

In step S12, a same surface flag is set for the process target surface, here, the reference surface A. In step S13, this surface, here, the reference surface A is highlighted on the display. In step S14, it is determined whether or not the next surface contiguous to the reference surface A exists.

Figure 17:
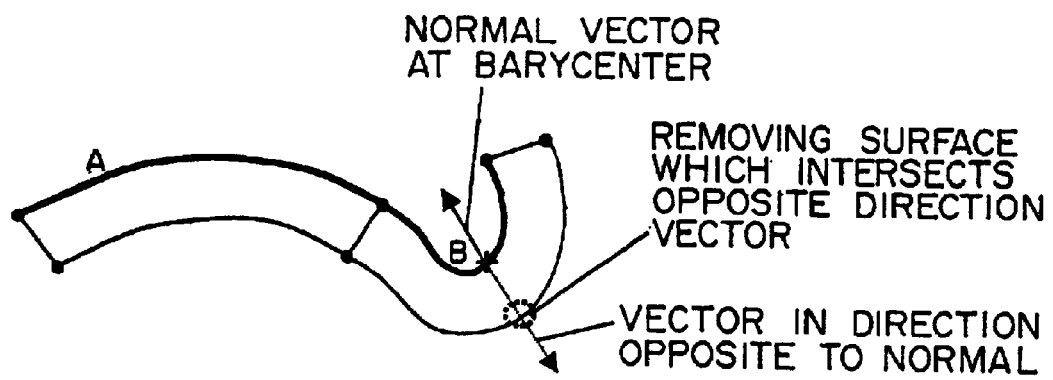
FIG. 17 explains the progression (No. 2) of the process for extracting a same surface from surface data of a metal plate having a curved surface.

A surface B contiguous to the reference surface A exists as shown in FIG. 17, and the operations in and after step S4 are performed for this contiguous surface recognized as a process target surface. A surface which intersects the vector in the direction opposite to the normal vector of the process target surface B is searched in a similar manner. After the operations in steps S8 to S10 are performed, the removal flag is set also for the intersecting surface in step S11, and the same surface flag is set for the process target surface, namely, the surface B in step S12. In step S13, the process target surface is highlighted.

Figure 18:
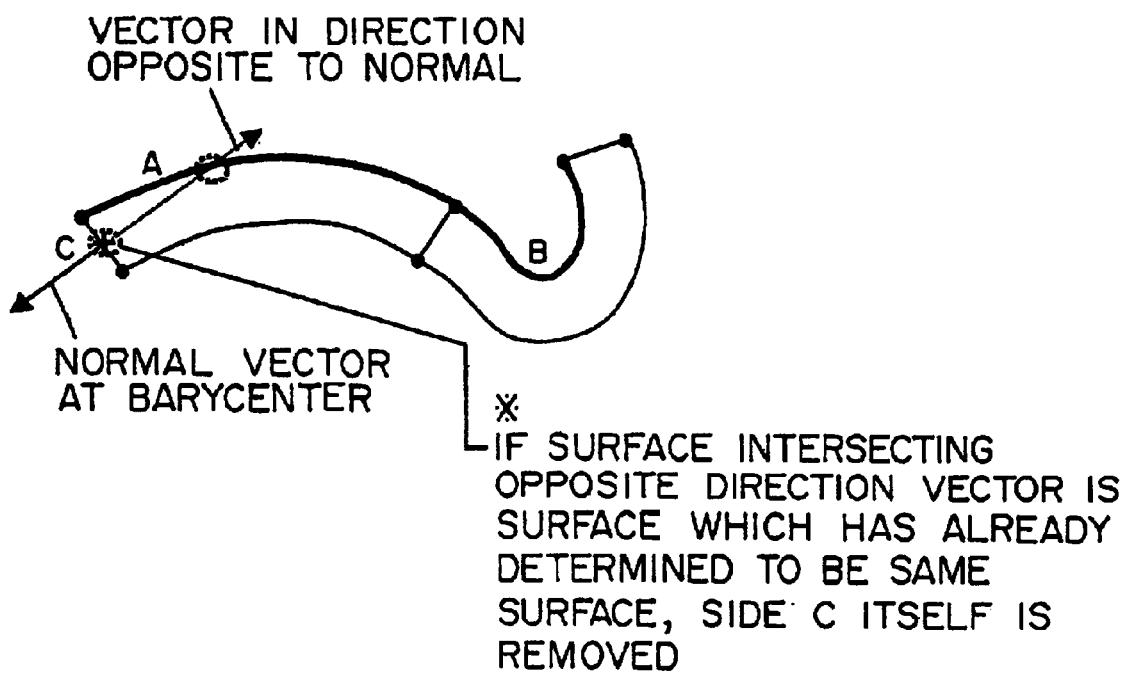
FIG. 18 explains the progression (No. 3) of the process for extracting a same surface from surface data of a metal plate having a curved surface.

Then, in step S14, it is determined whether or not the next contiguous surface exists. Here, a contiguous surface is not necessarily contiguous to an immediately preceding process target surface, and maybe considered as a surface yet to be processed. For example, a side C is selected as shown in FIG. 18, and the operations in and after step S4 are performed.

In a similar manner as in the above described case, a surface intersecting an opposite direction vector is searched in step S7. Here, the surface A as the reference surface selected by the user is found as the intersecting surface. Since the same surface flag is already set for the surface A, this surface is determined to be a surface that has determined as the same surface in step S9. In step S15, the removal flag is set for the process target surface, namely, the side C itself. The side C is then removed.

Figure 19:
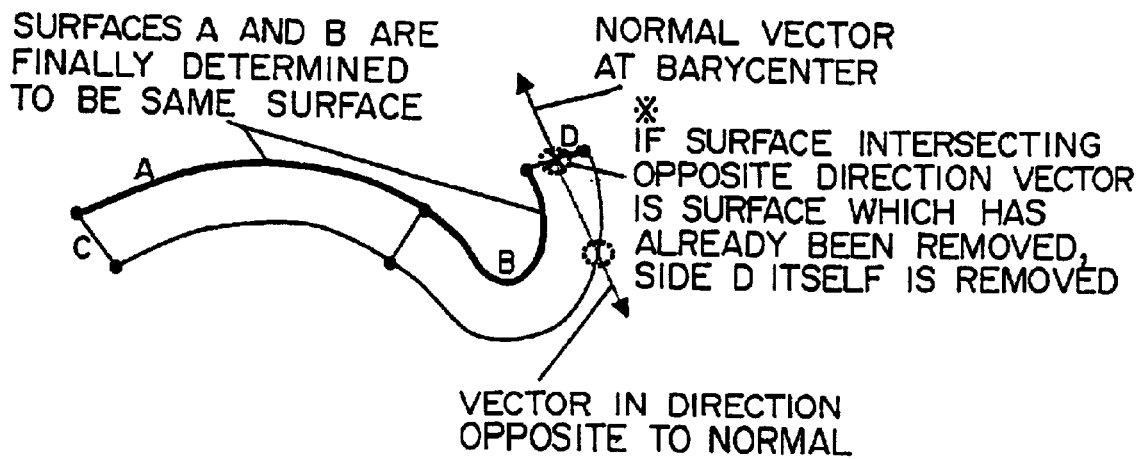
FIG. 19 explains the progression (No. 4) of the process for extracting a same surface from surface data of a metal plate having a curved surface.
Figure 21:
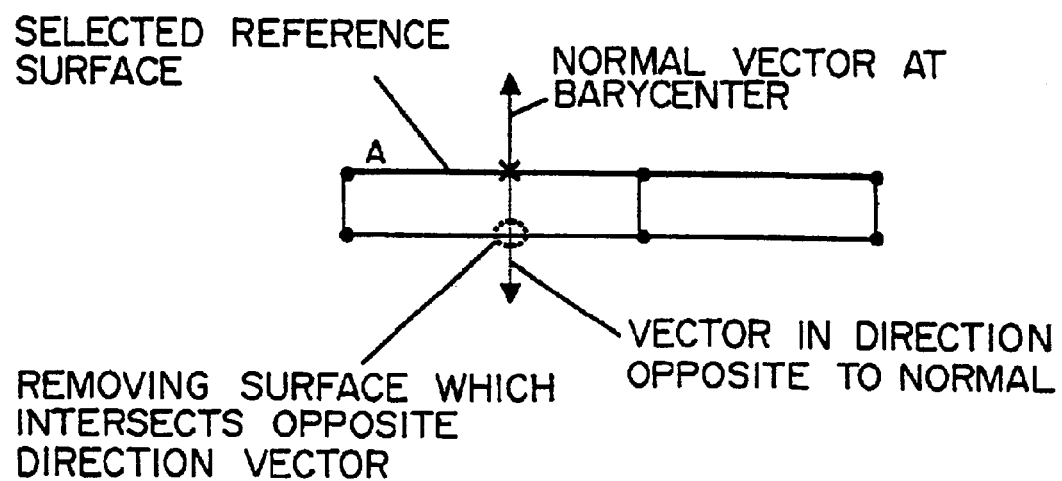
FIG. 21 explains the progression (No. 1) of a same surface extraction process for a metal plate having a flat surface (No. 1)
Figure 22:
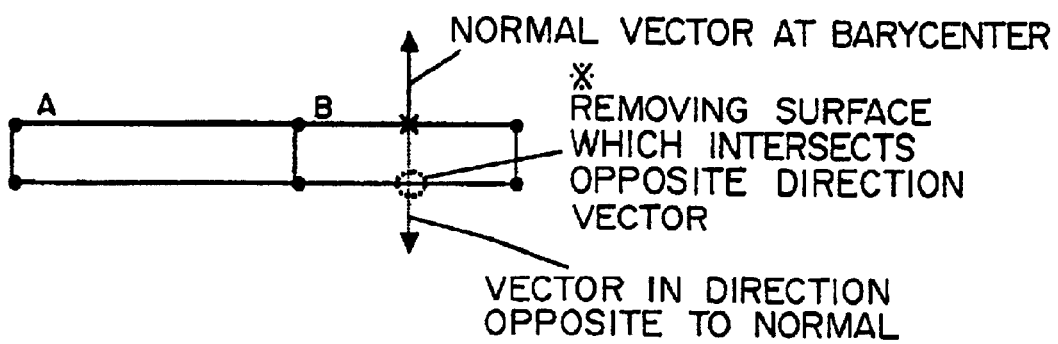
FIG. 22 explains the progression (No. 2) of the same surface extraction process for a metal plate having a flat surface.

In step S14, a side D is selected as a surface yet to be processed as shown in FIG. 19, and the operations in and after step S4 are performed. A surface that is searched as a surface intersecting an opposite direction vector in step S7 is a surface that has been removed as explained with reference to FIG. 17. In step S10, it is determined that the searched surface is a surface which has been removed. Then, in step S15, the process target surface, namely, the side D is also removed. Here, the process is terminated for all of the surfaces. Surfaces determined to be the same surface as the reference surface are two upper surfaces as shown on the right side of FIG. 15.

Figure 23:
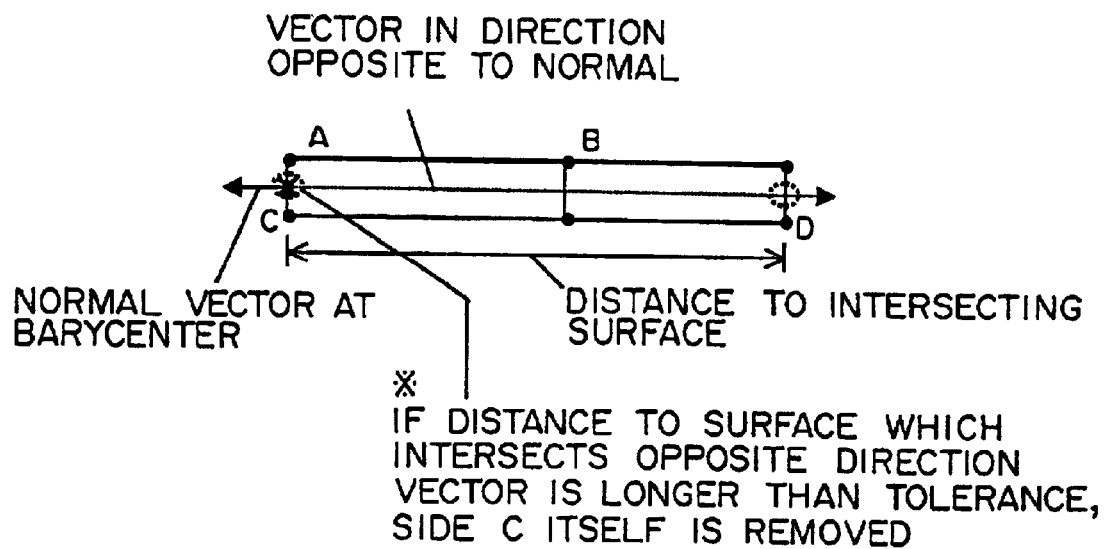
FIG. 23 explains the progression (No. 3) of the same surface extraction process for a metal plate having a flat surface.

FIGS. 21 to 24 explain the process for a flat surface shown in FIG. 20. A difference from the process shown in FIGS. 16 to 19 is the process shown in FIGS. 23 and 24. In FIG. 23, the process is performed for a side C on the left side, which is recognized as a process target surface. In step S8 of FIG. 14, the distance to the surface intersecting an opposite direction vector, here, a surface D is determined to be longer than a tolerance. Therefore, the process target surface, namely, the surface C itself is removed in step S15.

If the operation of step S8 in FIG. 14 is not performed, or if the distance to the intersecting surface is not longer than the thickness of the metal plate and not shorter than the width (the distance between the sides), the same surface flag is set for the process target surface, here, the side C in step S12 after the operations in steps S9 to S11 are performed. Accordingly, the side C is determined to be the same as the reference surface A.

Figure 24:
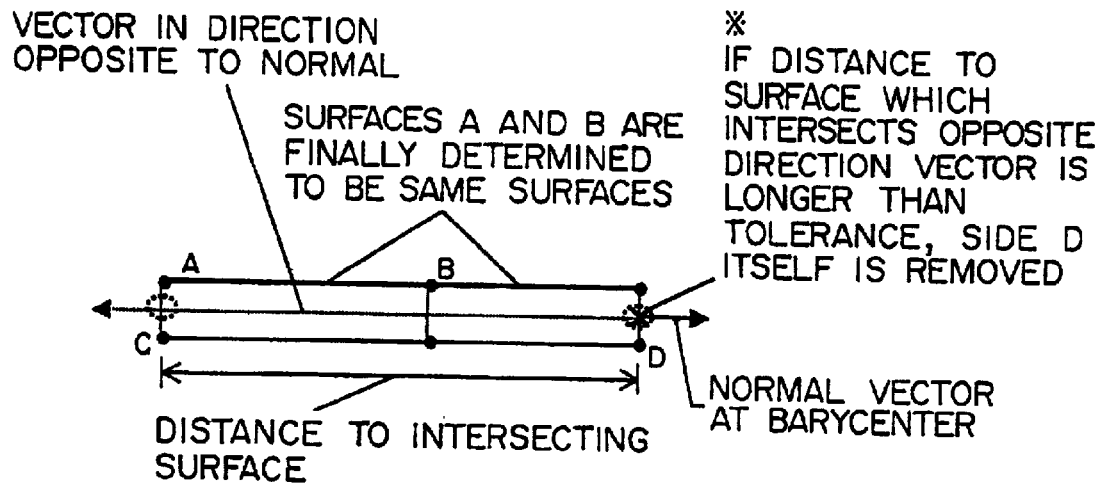
FIG. 24 explains the progression (No. 4) of the same surface extraction process for a metal plate having a flat surface.

In FIG. 24, the process is performed for the side D on the right side, which is recognized as a process target surface. Similar to the side C, the distance to the intersecting surface is determined to be longer than the tolerance in step S8. As a result, the removal flag is set for the process target surface, namely, the side D in step S15.

If a metal cabinet plate has a curved surface as shown in FIG. 15, the same surface extraction process explained in this preferred embodiment does not always yield a proper result. For example, if not the surface B but the side C is determined as a process target surface, and the vector in the direction opposite to the surface C intersects not the reference surface A but the surface B after the same surface flag is set for the reference surface A in FIG. 16, also the side surface C can possibly be determined as the same surface. Therefore, it should be noted that a proper result cannot be obtained depending on the shape of a curved surface, the arrangement of each surface configuring the same surface, the setting of a tolerance for the distance to an intersecting surface in step S8 of FIG. 14, or the like.

Figure 25:
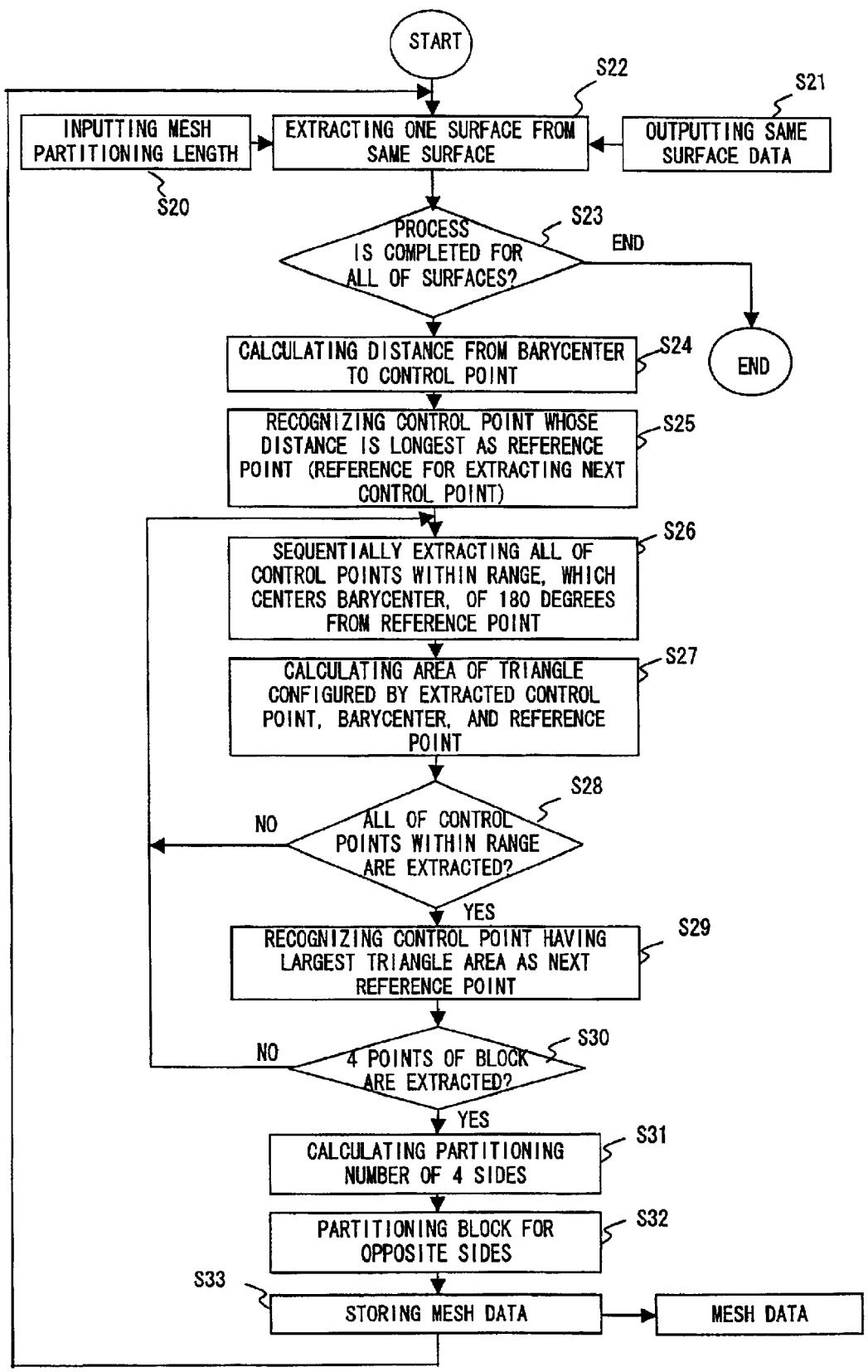
FIG. 25 is a flowchart showing the details of a 4-point block surface extraction/mesh partitioning process.

FIG. 25 is a flowchart showing the details of the process performed by the 4-point block surface extracting/mesh partitioning unit 26 shown in FIG. 5. Once the process starts in this figure, one of a plurality of surfaces which configure a same surface is extracted from the same surface in step S22 by using a mesh partitioning length input from a user in step S20, and same surface data output in step S21. In step S23, it is determined whether or not the process is completed for all of the plurality of surfaces that configure the same surface. If the process is not completed, distances from the barycenter of the extracted surface to a plurality of control points representing the surface are calculated for the extracted surface in step S24. Then, in step S25, a control point whose distance is the longest is determined to be a reference point.

Subsequent steps S26 to S30 correspond to the 4-point block surface extraction process, which is described below by citing the examples shown in FIGS. 26 to 29.

Figure 26:
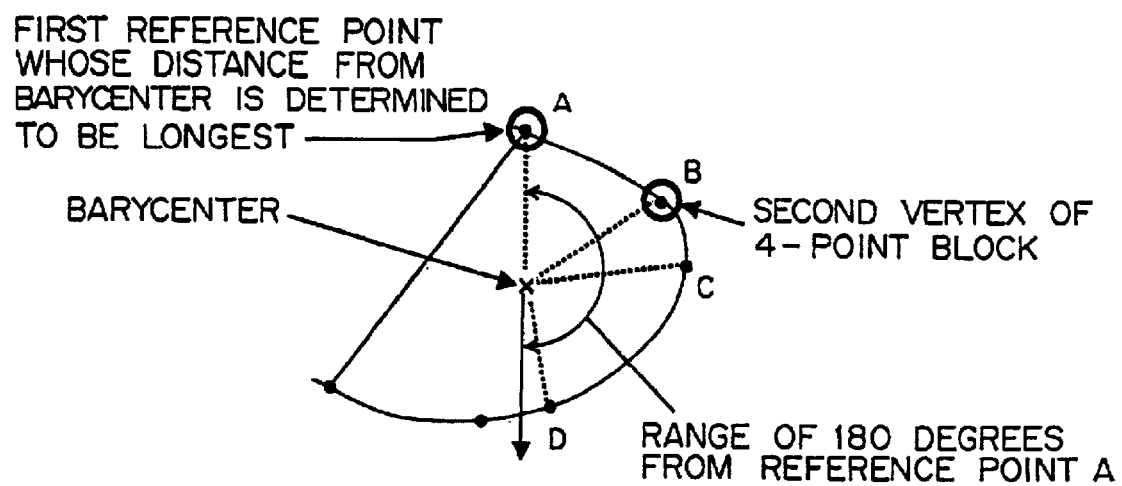
FIG. 26 exemplifies the extraction of a 4-point block surface (No. 1)

In step S26, all of control points within a range, which centers the barycenter, of 180 degrees from a reference point, a point A in FIG. 26 are sequentially extracted. Then, in step S27, the area of a triangle which is configured by each of the extracted control points, the barycenter, and the reference point is calculated in step S27. In step S28, it is determined whether or not all of the control points within the range of 180 degrees have been extracted. If all of the control points have not been extracted, the operations in and after step S26 are repeated.

If it is determined that all of the control points within the range of 180 degrees have been extracted, the control point corresponding to the triangle having the largest area is recognized as the next reference point in step S29. Then, in step S30, it is determined whether or not 4 points of a 4-point block surface, namely, the 4 vertexes of the quadrilateral have been extracted as reference points. If these points have not been extracted, the operations in and after step S26 are repeated.

In FIG. 26, points B, C, and D are sequentially extracted with the loop in steps S26 to S28 as all of the control points within the range of 180 degrees from the point which is recognized as the reference point in step S25, namely, the point A whose distance from the barycenter is determined to be the longest. In step S27, the areas of respective triangles are calculated. In step S29, the control point corresponding to the triangle having the largest area, here, the point B is recognized as the next reference point. Assuming that the barycenter is a point O in FIG. 26, the area of a triangle AOB is supposed to be larger than that of a triangle AOC.

Figure 27:
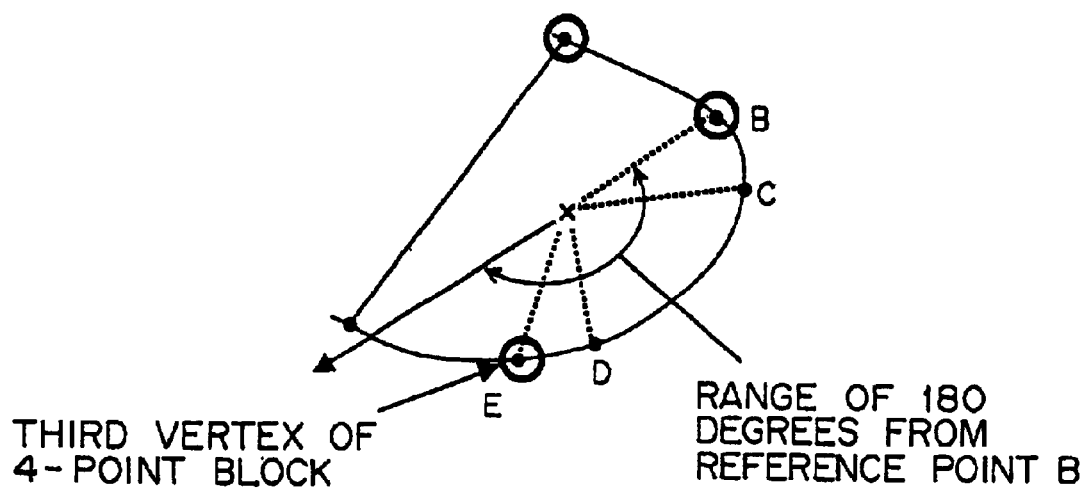
FIG. 27 exemplifies the extraction of the 4-point block surface (No. 2)

FIG. 27 explains the operations in steps S26 to S30 by recognizing the point B as a reference point. Points C, D, and E are extracted as control points within the range, which centers the barycenter O, of 180 degrees from the reference point B, and the control point E corresponding to the triangle having the largest area is recognized as the next reference point.

Figure 28:
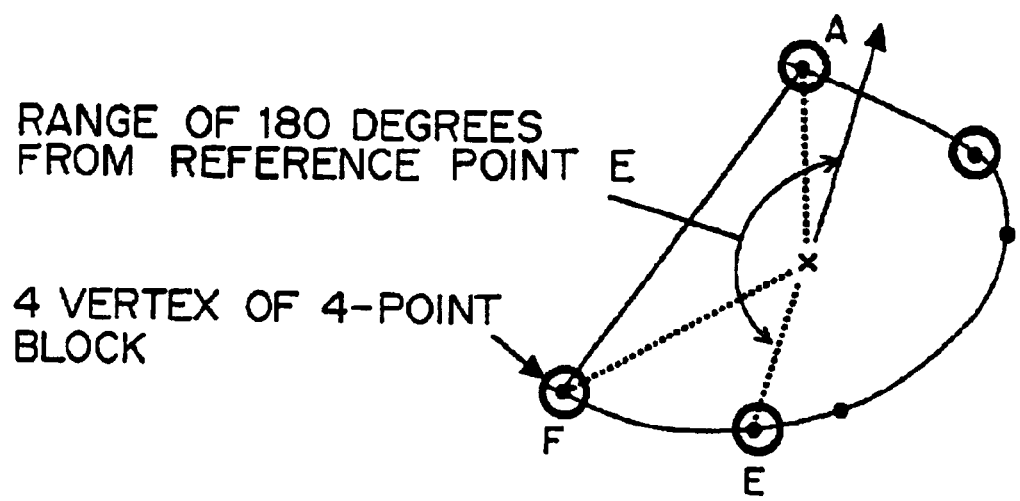
FIG. 28 exemplifies the extraction of the 4-point block surface (No. 3)
Figure 29:
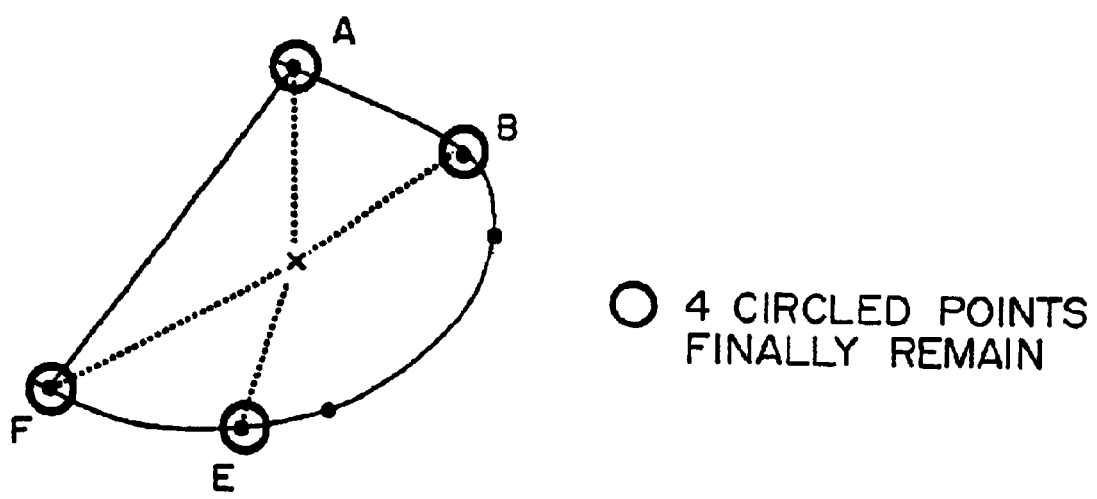
FIG. 29 exemplifies the extraction of the 4-point block surface (No. 4)

In FIG. 28, control points within the range, which centers the barycenter, of 180 degrees from the reference point E are extracted. If control points within the range, which centers the barycenter, of 180 degrees from a reference point as described above, a control point that has been recognized as a reference point is not extracted. Accordingly, a point F is recognized as the next reference point in step S29. In step S30, it is determined that 4 points have already been extracted, and a partitioning number of 4 sides is calculated in step S31.

The partitioning number is calculated in correspondence with the mesh partitioning length input from a user in step S20, namely, the length of the side of a mesh. However, if a remainder occurs when the length of each side of a quadrilateral as a 4-point block is divided by a specified partitioning length, 1 is added to the partitioning number.

Note that the mesh partitioning length input from a user is set to, for example, on the order of 1/20 of the wavelength of a maximum frequency in order to suit a calculation of the moment method. Additionally, if the partitioning numbers of opposite sides differ, also a shorter side is partitioned by the partitioning number of a longer side.

Then, in step S32, the equal partitioning for opposite sides, which is explained with reference to FIG. 11, is performed. In FIG. 11, one pair of opposite sides is partitioned into 5 meshes, whereas the other is partitioned into 3 meshes. Then, in step S33, the mesh data are stored. After the mesh data are stored, one remaining surface is extracted from the same surface data in step S22. The operations in and after step S23 are then performed. When a remaining surface cannot be extracted in step S22, namely, when it is determined that the process is completed for all of the surfaces in step S23, the process is terminated.

Figure 30:
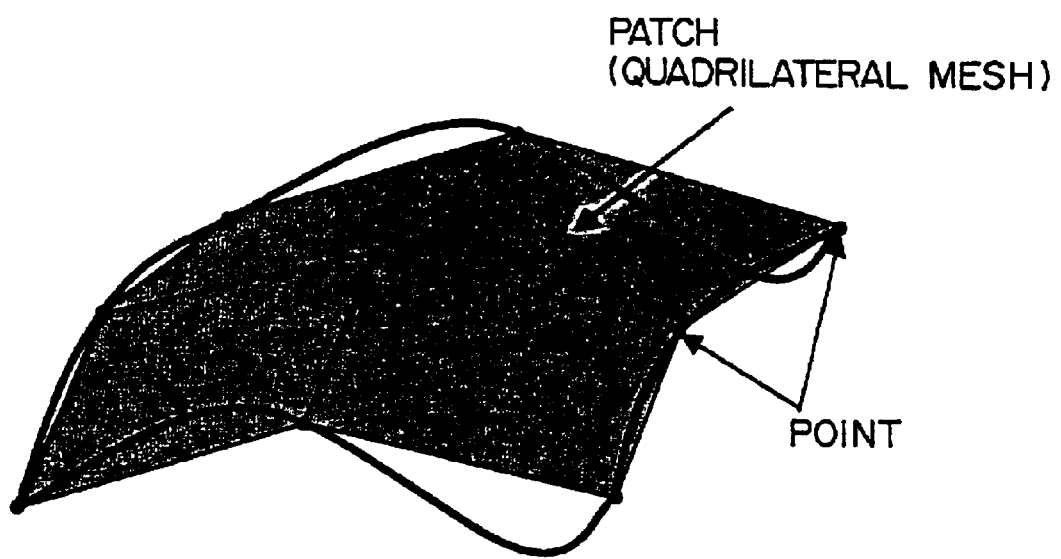
FIG. 30 explains the method representing a curved surface in data partitioned into meshes.

FIGS. 30 and 31 explain the structure of mesh data stored in the mesh data file 30 shown in FIG. 5. FIG. 30 exemplifies quadrilateral meshes (patches) corresponding to the curved surface of a metal cabinet, and each of the meshes is represented by points corresponding to mesh partitioning points.

FIG. 31 exemplifies the structure of mesh data. The mesh data is composed of coordinate specification data of vertexes of a polygon, and specification data of polygon configuring points. The coordinate specification data is composed of a point number for each of the points in FIG. 30, and x, y, and z coordinate values. The specification data of polygon configuring points is composed of a patch number for one polygon (quadrilateral mesh/patch), and point numbers of points which are the 4 vertexes of the patch.

Figure 32:
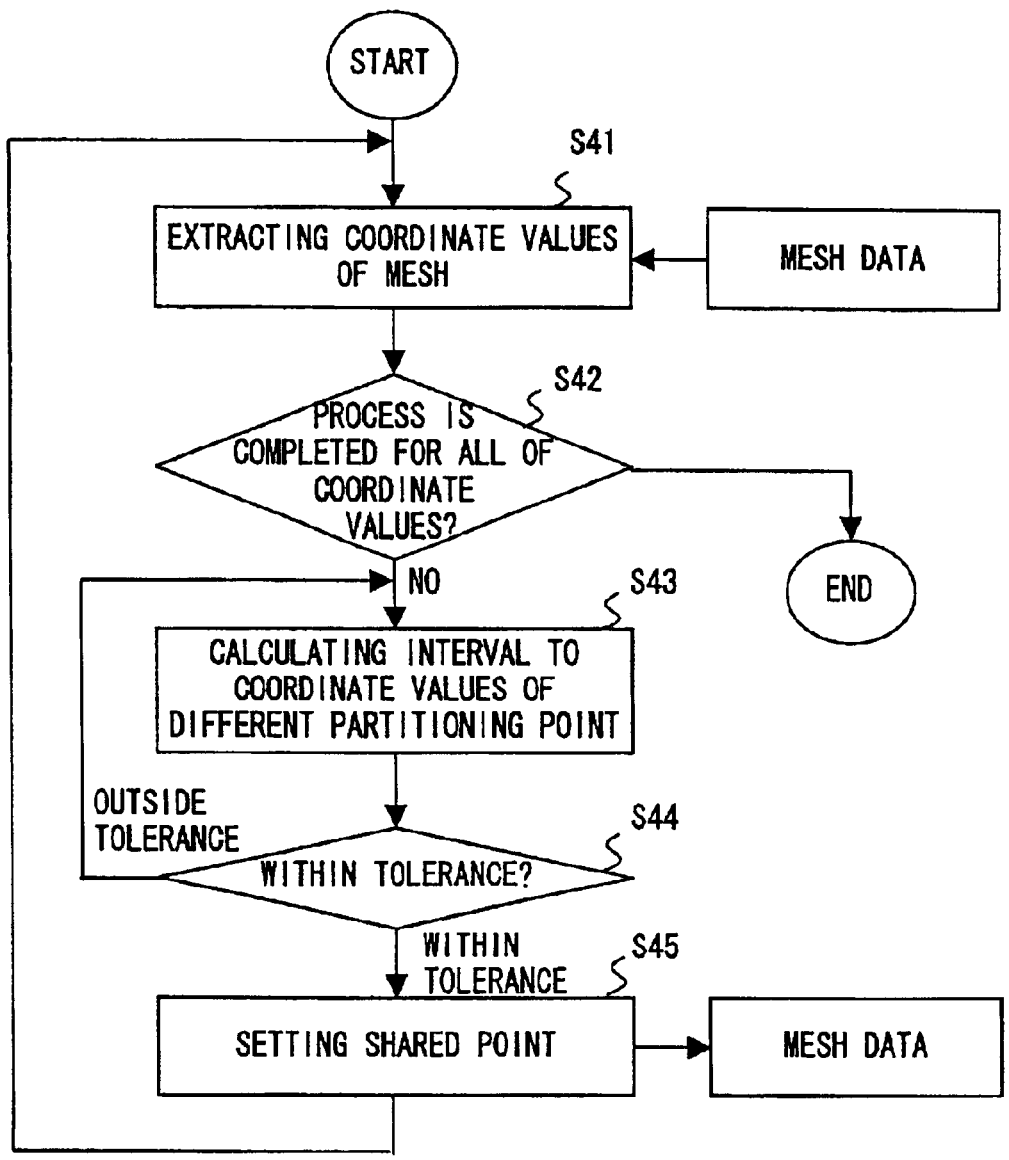
FIG. 32 is a flowchart showing the details of the process for a point shared by contiguous surfaces.

FIG. 32 is a flowchart showing the details of the process for a mesh partitioning point shared by contiguous surfaces, namely, the process performed by the contiguous surface point sharing unit 27 shown in FIG. 5. Once the process starts in this figure, coordinate values of a mesh partitioning point are extracted from mesh data in step S41. In step S42, it is determined whether or not the process is completed for the coordinate values of all of partitioning points. If the process is not completed, an interval between the coordinate values of the extracted partitioning point and a partitioning point which configures a contiguous surface is calculated in step S43. In step S44, it is determined whether or not the interval is within a tolerance. If the interval is larger than the tolerance, the operations in and after the calculation of the interval between the coordinate values of an extracted partitioning point and another partitioning point of the contiguous surface are repeated. In the calculation process of the interval between coordinate values, the x, y, and z coordinate values of a point corresponding to each partitioning point are already obtained as explained with reference to FIG. 31, and the interval is calculated by using these coordinate values.

If it is determined that the interval between the coordinate values is within the tolerance in step S44, the two partitioning points are set as a shared point in step S45, and stored as mesh data. The process then goes back to step S41 where the coordinate values of another mesh partitioning point are extracted, and the operations in and after step S42 are repeated. If there are no coordinate values of a mesh partitioning point to be extracted, it is determined that the process is completed for all of the partitioning points in step S42. Here, the point sharing process is terminated.

Figure 33:
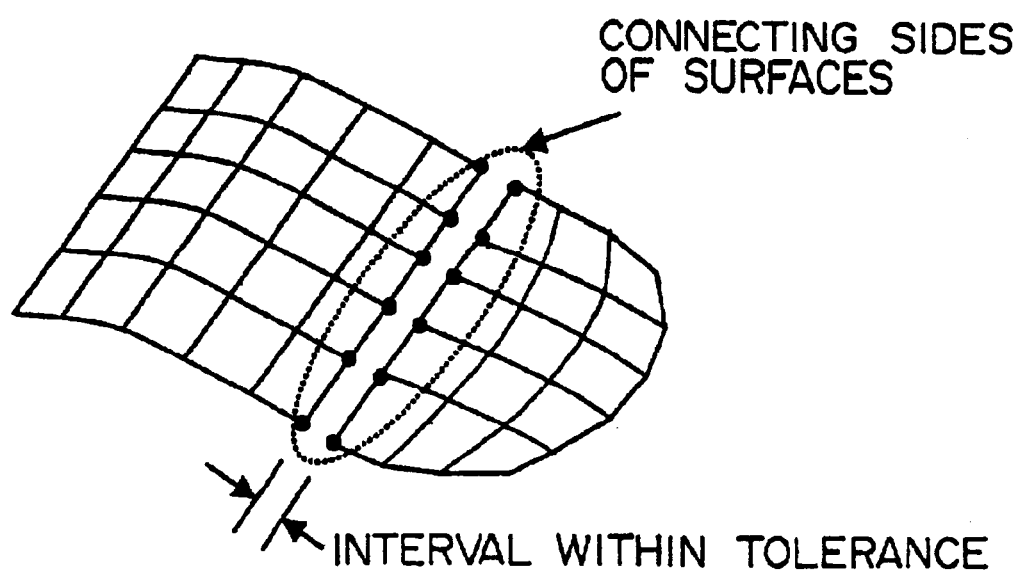
FIG. 33 shows a specific example of the process for a point shared by contiguous surfaces.

FIG. 33 exemplifies a result of the point sharing process. If it is determined that the intervals between partitioning points of two sides are within a tolerance between the sides of two surfaces as shown in FIG. 33, these two sides are determined to be connecting sides of the two surfaces. The partitioning points of the two sides are therefore set as shared points.

The process for sequentially extracting 4 vertexes of a 4-point block surface as reference points is earlier explained with reference to FIG. 25. If a shared point exists between contiguous 4-point block surfaces, this point is preferentially extracted as the next reference point.

Figure 34:
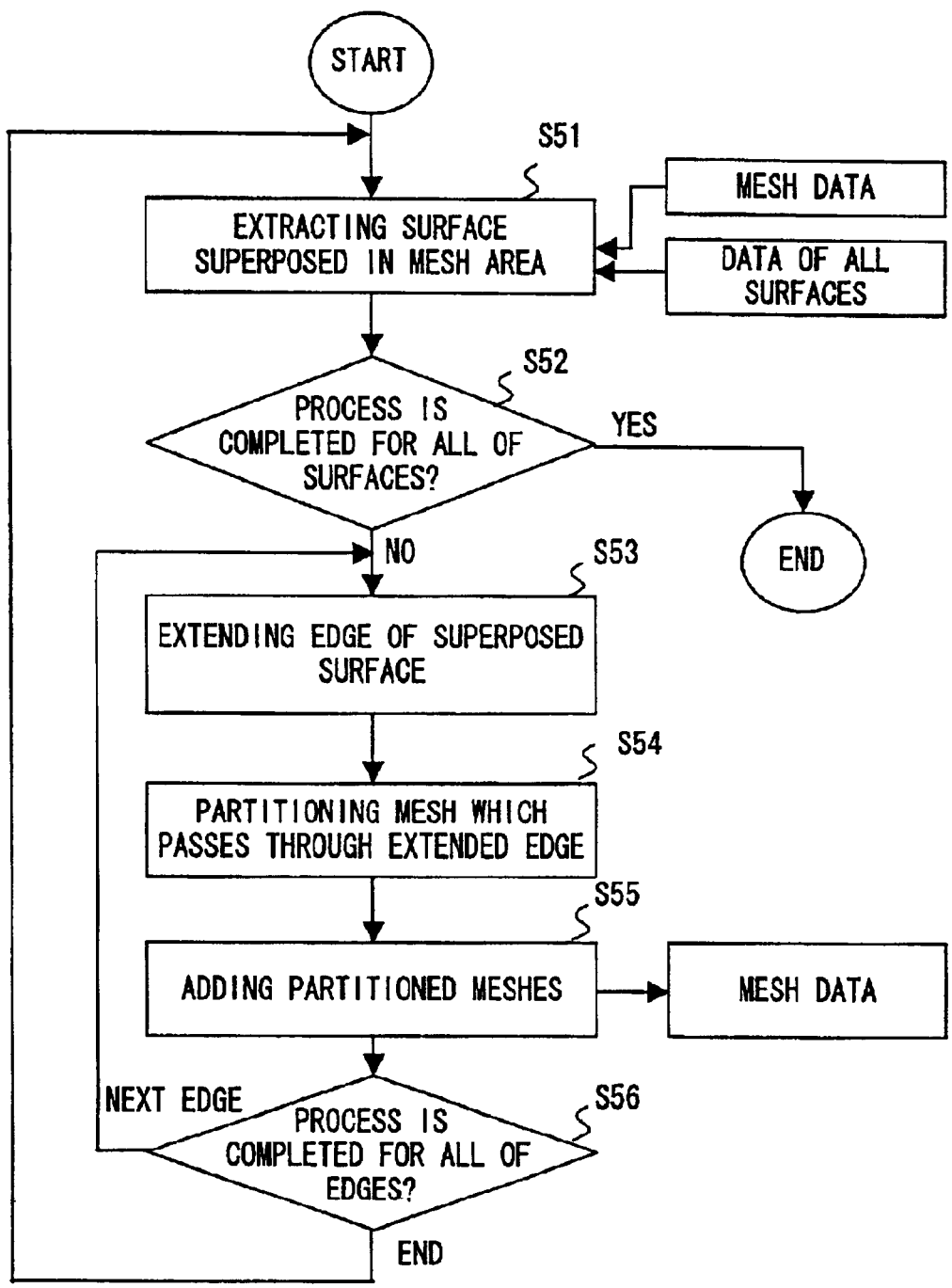
FIG. 34 is a flowchart showing the details of the process for aligning a mesh shape.

FIG. 34 is a flowchart showing the details of the process performed by the mesh shape aligning unit 28 shown in FIG. 5. With this process, if surfaces of different materials are superposed, meshes are repartitioned so that the shapes of the meshes of the surfaces are aligned.

FIG. 35 exemplifies this mesh shape alignment. In his figure, a surface of a different material, which has a smaller area and is indicated by thick lines, is superposed on a surface, which is partitioned into three meshes for respective pairs of opposite sides and indicated by thin solid lines.

The mesh shape alignment is made by extending the edges of the surface indicated by the thick solid lines to the ends of the meshes of the large surface, and by repartitioning the meshes through which the extended lines pass in correspondence with the extended lines. As a result, the meshes before being repartitioned are deleted. For example, the upper right mesh is repartitioned into 6 meshes among the thin solid line meshes before being repartitioned in FIG. 35. Such a mesh shape alignment method is applicable, for example, to the case where a metal surface has a hole or a chink. In this case, the mesh having the hole or the chink can be handled as a mesh whose electric conductivity is 0, after being aligned.

Once the process starts in FIG. 34, surfaces of different materials, which are superposed within a mesh area, are first extracted from mesh data and data of all surfaces in step S51. In step S52, it is determined whether or not the process is completed for all of such surfaces. If the process is not completed, an edge of the superposed surface is extended in step S53. Then, in step S54, meshes in the extended edge are repartitioned. In step S55, the repartitioned meshes are added to the mesh data. In step S56, it is determined whether or not the process is completed for all of the edges. If the process is not completed, the operations in and after step S53 are repeated for the next edge.

If it is determined that the process is completed for all of the edges of the extracted surface in step S56, the process goes back to step S51 where the next superposed surface is extracted. Then, the operations in and after step S52 are repeated. If the next superposed surface is not extracted in step S51, it is determined in step S52 that the process is completed for all of the surfaces. Here, the mesh shape alignment process is terminated.

The above described generation of data input to an electromagnetic field intensity calculating device can be executed by a general computer, as a matter of course. FIG. 36 is a block diagram showing the configuration of such a computer system. In this figure, a computer 51 is configured by a main body 52, and a memory 53. As the memory 53, a storage device of various types, such as a random access memory (RAM), a hard disk, a magnetic disk, etc. is available. A program recited in claims 7 and 8, or a program represented by the flowcharts shown in FIGS. 14, 25, 32, and 34 is stored in such a memory, and the program is executed by the main body 52, so that the generation of data input to an electromagnetic field intensity calculating device in the preferred embodiment can be implemented. Namely, it becomes possible to partition a metal surface of a metal cabinet of an electric circuit device into quadrilateral meshes which are suitable for a calculation of the moment method, and to output the mesh data after being partitioned to the electromagnetic field intensity calculating device.

Such a program may be transmitted from a program provider side via a network 54, and executed by the computer 51. Additionally, such a program may be stored on a marketed and distributed portable storage medium 55, so that the program stored on the portable storage medium 55 can be executed by being loaded into the computer 51. As the portable storage medium 55, a storage medium of various types, such as a CD-ROM, a floppy disk, an optical disk, a magneto-optical disk, etc. is available. The above described program is stored onto such a storage medium, and executed by the computer 51, whereby the generation of data input to an electromagnetic field intensity calculating device, which is explained in the preferred embodiment, can be implemented.

As described above in detail, according to the present invention, a metal cabinet model that is suitable for a calculation of the moment method, namely, a model partitioned into quadrilateral meshes can be automatically and quickly generated from three-dimensional structure data of a CAD system. Such a model is output to an electromagnetic field intensity calculating device, thereby accurately calculating the intensity of an electromagnetic field emitted from the whole of an electric circuit device including the metal cabinet. This greatly contributes to improvements in the practicality of an electromagnetic field intensity calculating device.

What is claimed is:

1. An input data generating method generating data imput to an electromagnetic field intensity calculating device which calculates an intensity of an electromagnetic field emitted from an electric circuit device having a metal cabinet, comprising:

extracting data of a same surface composed of a plurality of surfaces existing on a front or a back of a metal plate which configures the metal cabinet from a plurality of pieces of three-dimensional surface data, if the surface data is composed of the plurality of pieces of three-dimensional surface data including the front and the back of the metal plate;

partitioning each of the plurality of surfaces configuring the same surface into quadrilateral meshes; and outputting data partitioned into meshes to the electromagnetic field intensity calculating device.

2. The input data generating method according to claim 1, further comprising extracting control points corresponding to vertexes of a quadrilateral, when each of the plurality of surfaces is approximated to the quadrilateral by using data of control points as surface data of each of the plurality of surfaces configuring the same surface.

3. The input data generating method according to claim 2, further comprising recognizing the control points corresponding to the vertexes of the quadrilateral which approximates each of the plurality of surfaces to be 4 vertexes, and equally partitioning a flat or a curved surface determined by data of the control points for respective pairs of opposite sides so that the flat or the curved surface is partitioned into the quadrilateral meshes.

4. An input data generating method generating data input to an electromagnetic field intensity calculating device which calculates an intensity of an electromagnetic field emitted from an electric circuit device having a metal cabinet, comprising:

extracting surface data of the metal cabinet from three-dimensional data of the electric circuit device:

partitioning each of a plurality of surfaces into quadrilateral meshes, if the surface data of the metal cabinet is data corresponding to the plurality of surfaces;

making a comparison between coordinates of partitioning points on two sides which can possibly be a side shared by contiguous surfaces among the plurality of surfaces;

recognizing data of the partitioning points to be data shared by the contiguous surfaces, if the coordinates of the partitioning points are determined to match within a preset tolerance; and outputting data partitioned into meshes, which include the shared data, to the electromagnetic field intensity calculating device.

5. An input data generating method generating data input to an electromagnetic field intensity calculating device which calculates an intensity of an electromagnetic field emitted from an electric circuit device having a metal cabinet, comprising:

extracting surface data of the metal cabinet from three-dimensional data of the electric circuit device;

partitioning a surface corresponding to the surface data into quadrilateral meshes;

repartitioning the quadrilateral meshes by aligning the surface corresponding to the surface data of the metal cabinet with a shape of a surface whose material is different from the metal cabinet, and which is superposed on the corresponding surface and has an area smaller than the corresponding surface, exists, after the corresponding surface is partitioned into the quadrilateral meshes; and outputting data which is partitioned into meshes and further repartitioned to the electromagnetic field intensity calculating device.

* * * * *

UNITED STATES PATENT AND TRADEMARK OFFICE
CERTIFICATE OF CORRECTION

PATENT NO. : 6,766,261 B2
DATED : July 20, 2004
INVENTOR(S) : Sekiji Nishino et al.

It is certified that error appears in the above-identified patent and that said Letters Patent is hereby corrected as shown below:

Column 13,
Line 40, change "imput" to -- input --.

Signed and Sealed this

Twenty-first Day of December, 2004

JON W. DUDAS
*Director of the United States Patent and Trademark Office*